(12) United States Patent
Cassel

(10) Patent No.: US 7,554,221 B2
(45) Date of Patent: Jun. 30, 2009

(54) HIGH VOLTAGE PULSED POWER SUPPLY USING SOLID STATE SWITCHES WITH DROOP COMPENSATION

(75) Inventor: Richard L. Cassel, Palo Alto, CA (US)

(73) Assignee: Stangenes Industries, Inc., Palo Alto, CA (US)

( * ) Notice: Subject to any disclaimer, the term of this patent is extended or adjusted under 35 U.S.C. 154(b) by 126 days.

(21) Appl. No.: 11/683,270

(22) Filed: Mar. 7, 2007

(65) Prior Publication Data

US 2007/0146092 A1    Jun. 28, 2007

Related U.S. Application Data

(63) Continuation-in-part of application No. 10/838,600, filed on May 4, 2004, now Pat. No. 7,301,250.

(51) Int. Cl.
    *H03K 3/00*    (2006.01)
(52) U.S. Cl. ....................................... 307/108
(58) Field of Classification Search ................. 307/106, 307/108
    See application file for complete search history.

(56) References Cited

U.S. PATENT DOCUMENTS

| | | |
|---|---|---|
| 3,343,007 A | 9/1967 | Massey |
| 4,011,463 A | 3/1977 | Fasching |
| 4,105,952 A | 8/1978 | Tulip |
| 4,375,594 A | 3/1983 | Ewanizky, Jr. |
| 4,645,941 A | 2/1987 | Nicolas |
| 4,680,671 A | 7/1987 | Brion et al. |
| 4,704,543 A | 11/1987 | Barker et al. |
| 5,245,253 A | 9/1993 | Quazi |
| 5,311,067 A | 5/1994 | Grothaus et al. |
| 5,365,421 A | 11/1994 | Eastman |

(Continued)

FOREIGN PATENT DOCUMENTS

JP    56-110282    9/1981

(Continued)

OTHER PUBLICATIONS

D. Sprehn et al, X-Brand klystron development at the Stanford Linear Accelerator Center, SLAC-PUB-8346, Mar. 2000.

(Continued)

*Primary Examiner*—Albert W Paladini
*Assistant Examiner*—Michael Rutland Wallis
(74) *Attorney, Agent, or Firm*—Workman Nydegger

(57) ABSTRACT

Systems and methods for generating a high voltage pulse. A series of voltage cells are connected such that charging capacitors can be charged in parallel and discharged in series. Each cell includes a main switch and a return switch. When the main switches are turned on, the capacitors in the cells are in series and discharge. When the main switches are turned off and the return switches are turned on, the capacitors charge in parallel. One or more of the cells can be inactive without preventing a pulse from being generated. The amplitude, duration, rise time, and fall time can be controlled with the voltage cells. Each voltage cell may also includes a balance network to match the stray capacitance seen by each voltage cell. Droop compensation is also enabled.

18 Claims, 11 Drawing Sheets

U.S. PATENT DOCUMENTS

| | | | |
|---|---|---|---|
| 5,391,998 | A | 2/1995 | Symons |
| 5,905,371 | A | 5/1999 | Limpaecher |
| 5,905,646 | A * | 5/1999 | Crewson et al. ............. 363/132 |
| 6,060,791 | A | 5/2000 | Goerz et al. |
| 6,066,901 | A | 5/2000 | Burkhart et al. |
| 6,078,110 | A | 6/2000 | Zakharian |
| 6,166,459 | A | 12/2000 | Holland et al. |
| 6,205,200 | B1 | 3/2001 | Boyer et al. |
| 6,667,875 | B1 | 12/2003 | Hartmann |
| 6,831,377 | B2 | 12/2004 | Yampolsky et al. |
| 7,209,373 | B2 * | 4/2007 | Oicles et al. ................... 363/59 |
| 2002/0105773 | A1 | 8/2002 | Seely et al. |
| 2003/0016711 | A1 | 1/2003 | Crawford |
| 2005/0248216 | A1 | 11/2005 | Cassel |
| 2006/0139977 | A1 | 6/2006 | Oicles |
| 2007/0139090 | A1 * | 6/2007 | Cassel ......................... 327/181 |

FOREIGN PATENT DOCUMENTS

| | | |
|---|---|---|
| JP | 01066985 A | 3/1989 |
| JP | 10-177051 | 6/1998 |
| JP | 1999136100 | 5/1999 |
| JP | 2005223867 | 8/2005 |
| WO | 2005060097 | 6/2005 |
| WO | 2006057365 | 6/2006 |

OTHER PUBLICATIONS

R. Koontz et al, NLC Klystron Pulse Modulator R&D at SLAC, 1998 IEEE.

R. Cassel et al, Solid State Induction Modulator replacement for SLAC Klystron Modulators, $24^{th}$ International Power Modulator Symposium, Norfolk, VA, Jun. 2000.

M. Gaudreau et al, Solid-State Pulsed Power Systems, $23^{rd}$ International Power Modulator Symposium, Rancho Mirage, CA, Jun. 1998.

G. Caryotakis et al, The Next Linear Collider Klystron Development Program, Linac 2000, XX International Linac Conference.

A. Kransnykh et al, A Solid State Marx Type Modulator for driving a TWT.

Krasnykh, Analysis of Klystron Modulator Approaches for NLC, XX International Linac Conference, Monterey, CA Aug. 21-25, 2000.

Casey, et al, Solid-State Pulsed Power Systems for the Next Linear Collider, International Power Modulator Conference, Hollywood, CA, Jun. 30-Jul. 3, 2002.

C. Pappas et al., "Damping Ring Kickers for the Next Linear Collider," Proceedings of the 1999 Particle Accelerator Conference, New York, pp. 1500-1502.

Carlier, E. et al, "Solid state switch application for the LHC extraction kicker pulse generator," in Proc. of International Power Modulation Symposium, pp. 67-70, Jun. 25-27, 1996. See abstract figure 1; pp. 67-69.

J.W. Baek, D.W. Yoo, T.J. Kim, M.H. Ryu, G.Y. Cho, H.G. Kim; Pulse Generator Using Series—Connected Boost Converter; The Journal of the Korean Institute of Electrical Engineers; Feb. 2003.

J.W. Baek, H.G. Kim; High Voltage Pulse Generator Using Power Semiconductor Switches; The Journal of the Korean Institute of Electrical Engineers; Aug. 2001.

U.S. Appl. No. 11/679,769, filed Oct. 15, 2008, Non-Final Office Action.

* cited by examiner

HIGH VOLTAGE PULSED POWER SUPPLY USING SOLID STATE SWITCHES WITH DROOP COMPENSATION

CROSS-REFERENCE TO RELATED APPLICATIONS

This application is a continuation-in-part of U.S. patent application Ser. No. 10/838,600 filed May 4, 2004 and entitled, HIGH VOLTAGE PULSED POWER SUPPLY USING SOLID STATE SWITCHES, which application is incorporated herein by reference in its entirety.

BACKGROUND OF THE INVENTION

1. The Field of the Invention

The present invention relates to systems and methods for generating high voltage pulses. More particularly, the present invention relates to systems and methods for generating high voltage pulses controlled by solid state switches.

2. Background and Relevant Art

Many applications need a pulsed power supply that is able to deliver high voltage pulses. Spectrometers, klystrons, accelerators, radar transmitters, high impedance electron guns, ion tubes, liquid polarizing cells, etc., are examples of applications that need high voltage pulses. In conventional systems, a pulsed power supply uses a high voltage pulse forming network and some sort of switch such as a spark gap or a thyratron.

These types of pulsed power supplies are often created using principles of Marx Generators. Generally, a Marx Generator is circuitry that generates a voltage pulse by charging a group of capacitors in parallel and then discharging the capacitors in series. FIG. 1 illustrates an example of a typical Marx Generator. In FIG. 1, a charging voltage 101 is applied to a pulse forming network 100. The stage capacitors 104 charge through the resistors 102 in a parallel fashion. The spark gaps 106 prevent the capacitors 104 from discharging into a load 108 until certain conditions are satisfied.

When the capacitors 104 are sufficiently charged, the lowest gap is typically allowed to break down or is triggered. When the lowest gap breaks down or triggers, two capacitors are effectively in series and the next gap breaks down. Very quickly, all of the gaps break down. The result of this process is that the capacitors 104 are connected in series and a voltage pulse is generated and delivered to the load 108. The capacitors 104 of a Marx Generator may also be charged using inductors or a series of transformers. In other example, the resistors 102 are replaced with inductors. The spark gaps can alternatively be replaced, for example, with switches such as thyratrons.

Because a Marx Generator is charged in parallel, the magnitude of the voltage pulse can be increased by adding additional charging sections. However, it has been found that the number of sections that can be stacked together is effectively limited by stray capacitance. As the number of sections in the pulse forming network increases, the stray capacitance to ground also increases. One of the effects of stray capacitance is that the current is diverted to ground. The stray capacitance also has an adverse affect on the rise time and/or fall times of the voltage pulse. The stray capacitance therefore limits the number of sections that can be included in the pulse generator.

The stray capacitance can also have an impact on the voltage that a particular section sees. In addition, the stray capacitance seen by one section is usually different from the stray capacitance seen by another section of the Marx Generator. Because the stray capacitance is not balanced across the sections of the pulse generator, some of the sections may experience higher voltages and may therefore malfunction. Although most systems are affected by stray capacitance, the inductors, resistors, transformers, and isolated supplied needed to charge the capacitors in the pulse generator also add stray capacitance to the pulse generator. In other words, the components of conventional pulse generators introduce additional stray capacitance to the system and further reduce the number of sections that can be successfully connected together.

Because Marx Generators are often used to generate high voltages, they can be quite large in both size and weight. In addition, a Marx Generator that generates hundreds of kilovolts should be using oil. Oil is typically necessary, but is often undesirable. Conventional pulsed power supplies or Marx Generators are often large and expensive, are limited by stray capacitance, and use components (such as thyratrons) that reduce their reliability.

BRIEF SUMMARY OF THE INVENTION

These and other limitations are overcome by embodiments of the present invention, which relates to systems and methods for generating a voltage pulse. In one embodiment of the invention, a series voltage cells with relatively low voltage requirements can be stacked together in series, each voltage cell including a capacitor connected in series with a switch (such as a solid state switch) that can be turned on and off. When multiple voltage cells are connected to form a pulse generator, the capacitors of the voltage cells are charged in parallel and discharged in series using one or more switches. Main switches are used at least to discharge the capacitors and return switches are used at least to charge the capacitors.

When the voltage cells are stacked, for example, the capacitors and main switches are connected in series. The capacitors are isolated from each other by the main switches which are turned off. When the main switches are on, the capacitors are connected in series and a voltage pulse is generated. When the main switches are off, the return switches may be turned on and provide a return path for the current that charges the capacitors in the voltage cells. Thus, the return switches are off when the main switches are on such that the capacitors discharge to the load. Advantageously, the capacitors can be charged without the use of inductors, resistors, or isolated supplies, thereby reducing some of the stray capacitance associated with conventional Marx Generators. In addition, the switches can be driven by use of an auxiliary supply without using inductors, resistors, isolated supplies, or step down supplies.

The capacitors in each voltage cell can be charged through a diode string supply line. A return path for the charging current is provided through return switches. When the capacitors are charging or are charged, main switches placed between successive capacitors are in an off state and prevent the capacitors from discharging in series. When the main switches are turned on, the capacitors are then connected in series and discharge. During discharge, the return switches are turned off. To recharge the capacitors, the main switches are turned off and the return switches are turned back on. The return switches can also be turned on during discharge to help, in one embodiment, decrease the fall time of the pulse by providing a path for the stray capacitance to discharge.

The voltage cells can also be configured to generate either a positive or a negative voltage pulse. In one embodiment, a bipolar pulse generator has a capacitor bank that includes a series of voltage cells configured to generate a positive pulse can be connected with a capacitor bank that includes a series of voltage cells configured to generate a negative pulse. This bipolar pulse generator can charge all of the capacitors in both sets of voltage cells at the same time. The switches in the respective capacitor banks can be controlled to discharge one set of capacitors to generate either the positive or the negative pulse. In addition, voltage cells that are configured to charge in series can be added to provide droop control and control the shape of the generated voltage pulse.

Each voltage cell may also includes a balance network that balances the stray capacitance seen by that voltage cell. Because each voltage cell in a series of voltage cells "sees" a different stray capacitance, the balance networks can be adapted to match the stray capacitance seen by the voltage cells. This has the benefit of balancing the voltage seen by each cell.

The voltage cells can be used to adjust the voltage pulse by controlling which voltage cells are active. In other words, one or more of the voltage cells can be made inactive to alter the voltage pulse without affecting the ability to generate the voltage pulse. At the same time, the failure of a particular cell does not prevent the pulse generator from pulsing. Thus, embodiments of the present invention can control the amplitude of the voltage pulse, a duration or width of the voltage pulse, the rise and fall times of the voltage pulse, and the like or any combination thereof.

In one embodiment of a pulse generator, some of the voltage cells can further be configured to include a ringing circuit that can be used to provide droop correction. The circuit can provide droop compensation or droop correction to the output of the pulse generator such that the droop correction is smooth rather than jagged or saw-toothed. The ringing circuit includes capacitors that charge in series and then discharge in parallel to a ringing capacitor, which is able to discharge in a manner to provide smooth droop compensation or correction.

In another embodiment of the invention, the voltage cells provide isolation protection. For example, if a particular voltage cell fails, then that cell can be isolated without impacting the ability of the pulse generator to generate and deliver a pulse to a load. Each voltage cell typically includes a diode across the return switch. If the main switch is off, then the discharge current can flow through this diode and the cell is effectively isolated.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to systems and methods for generating a voltage pulse. Embodiments of the invention can control an amplitude of the voltage pulse, a duration or width of the voltage pulse, a rise time of the voltage pulse, a fall time of the voltage pulse, and the like or any combination thereof. Some embodiments of the invention can generate and deliver a voltage pulse without the use of transformers.

Embodiments of the invention include voltage cells that typically have both a capacitor and a switch in series. The first and last voltage cells in a series of voltage cells may be adapted to connect to the load. Return switches are also included in most voltage cells. The return switches provide a path for the charging current supplied through a diode chain or a diode chain supply line. Advantageously, the return switches eliminate the use of inductors, resistors, and isolated supplies prevalent in conventional pulse generators. The switch drives are also provided with energy through an auxiliary diode chain, thereby eliminating the need for inductors, resistors, isolated supplies, and step down supplies that would otherwise be needed to provide the auxiliary power to the switch drives. Also, the elimination of these components reduces the stray capacitance to ground associated with the systems and methods described herein, which enables more voltage cells or sections to be stacked in series.

Figure 1:
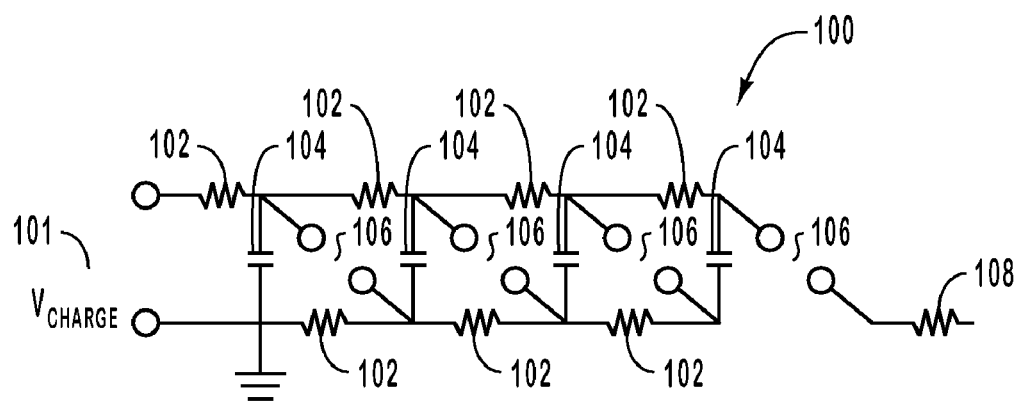
FIG. 1 illustrates an example of a Marx Generator that uses spark gaps to generate a voltage pulse.
Figure 2:
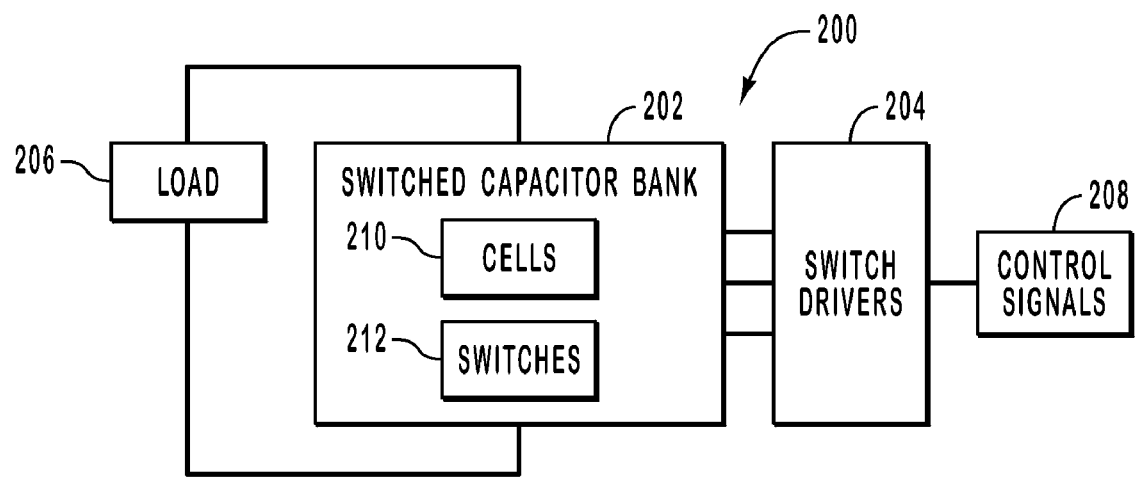
FIG. 2 illustrates one embodiment of a pulse generator that uses switches to control a series of voltage cells.

FIG. 2 illustrates a block diagram of one embodiment of a pulse generator or system for generating and delivering a high voltage pulse to a load. More particularly, the system 200 generates and delivers a high voltage pulse to the load 206. In the system 200, a switched capacitor bank 202 includes one or more capacitor or voltage cells 210 that are typically arranged in series. The voltage cells 210 are used to store the energy that is delivered to the load 206 as a voltage pulse.

The voltage cells 210 are typically associated with switches 212 that are controlled by the switch drivers 204. By controlling the control signals 208, the switch drivers 204 can turn the switches 212 on/off. The state of the switches 212, determines whether the voltage cells 210 are charging or discharging through the load 206. In one embodiment, the switches can be switched on and or off at particular times. The timing of the control signals 208 can alter the rise time of the voltage pulse, the fall time of the voltage pulse, and the like. Some embodiments of the invention also enable the waveform to be shaped or otherwise controlled.

In one embodiment, the effects of stray capacitance are reduced such that more voltage cells can be connected in series. Because more voltage cells can be connected in series, a lower voltage source can be used to generate a larger voltage pulse. Also, the switch drivers can be rated for lower voltages. As a result, the cost and size of the pulse generator are typically reduced.

In one embodiment of the system 200, the voltage cells are charged in parallel and discharged in series by controlling the state of the switches 212. One of the advantages of the system 200 is that one or more of the voltage cells 210 can fail without preventing the system 200 from delivering a high voltage pulse to the load 206. The system 200 can be configured to deliver a positive voltage pulse, deliver a negative voltage pulse, or deliver either a positive or negative voltage pulse (bipolar output). In addition, the control signals 208 can be used to control a duration of the voltage pulse, a magnitude of the voltage pulse, a rise time of the voltage pulse, and the like or any combination thereof. The control signals may be optically coupled to the switch drivers 204 in one embodiment.

Figure 3A:
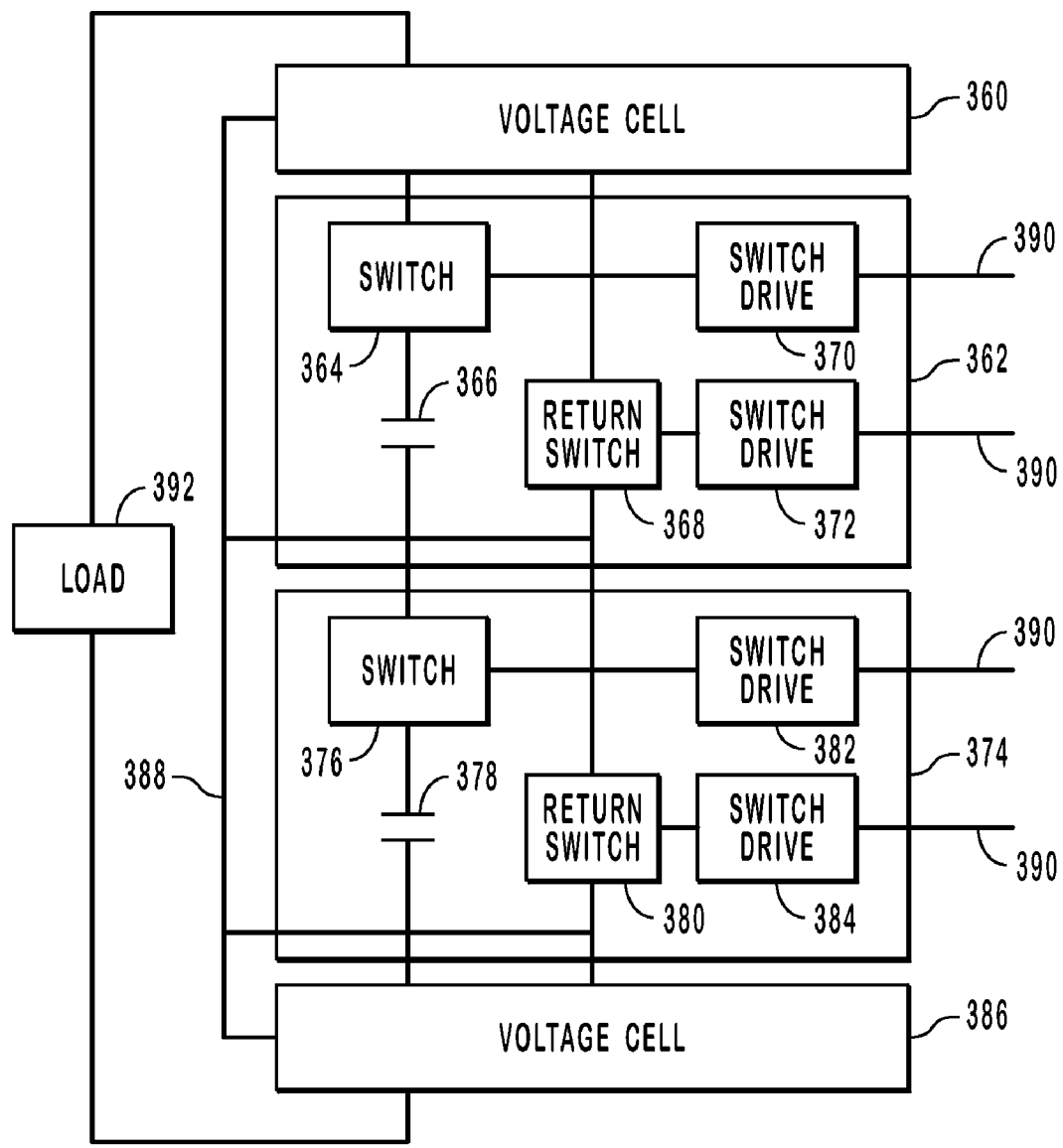
FIG. 3A illustrates a series of voltage cells and illustrates a main switch used to connect the capacitors in the voltage cells in series and return switches that provide a return path for a charging current.

FIG. 3A illustrates a diagram of one embodiment of a system for storing and/or delivering a high voltage pulse to a load. More particularly, FIG. 3A illustrates a few voltage cells connected in series, but one of skill in the art can appreciate the more or fewer voltage cells can be included. Each voltage cell is similarly configured and operate together to (i) charge the capacitors in parallel or independently of other voltage cells and (ii) discharge the capacitors in series.

For example, the voltage cell 362 includes, in this example, a capacitor 366 that is used to store a charge. At the same time, the capacitor 378 in the voltage cell 374 is also storing a charge. When storing a charge, the switches 364 and 376 (and similar switches in other voltage cells) are off. Thus, the capacitors 366 and 378 can charge in parallel or independently.

Figure 3B:
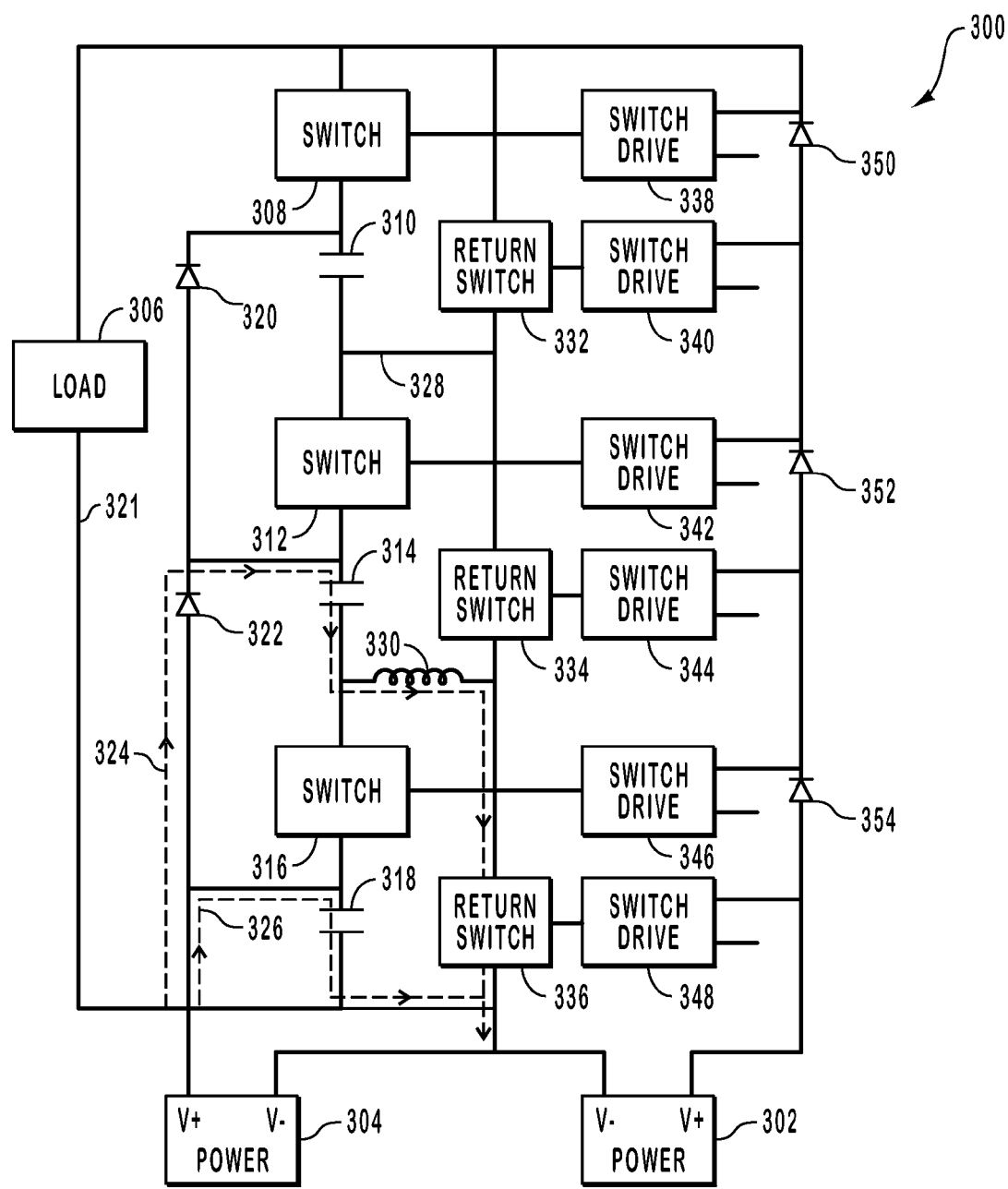
FIG. 3B is a more detailed diagram of one embodiment of a pulse generator and illustrates the path of the charging current for each voltage cell through a diode string supply and illustrates a diode string to provide auxiliary power to the switch drives.

The capacitors 366 and 378 are charged by the supply line 388 and because the switches 364 and 376 are off, the return switches 368 and 380 are turned on to provide a return path for the charging current provided through the supply line 388. As illustrated in FIG. 3B, the supply line 388 is a diode string and typically includes one or more diodes to separate the voltage cells. The switch drives 370 and 382 control the state of the switches 364 and 376, respectively. The switch drives 372 and 384 control the state of the return switches 368 and 380, respectively. The control lines 390 can be used to control the states of the switches 364, 376 and the states of the return switches 368, 380.

When the switches 364, 376 are turned on and the return switches 368, 380 are turned off, then the capacitors 366, 378 are connected and discharge in series to the load 392. In other words, connecting and discharging the capacitors 366, 378 in series generates a high voltage pulse that is applied to the load 392. Turning off the switches 364, 376 can terminate the pulse. Thus, the duration of the pulse can be controlled through controlling the switches 364, 376. If a particular voltage cell is non-functional, the supply line 388 is an example of the path that the current can follow during delivery of the pulse. In other words, a non-functional voltage cell does not prevent a pulse from being generated or delivered to the load 392.

FIG. 3B illustrates one embodiment of a high voltage pulse generator. This embodiment includes three voltage cells, but as previously stated, one of skill in the art can appreciate that more or fewer stages can be included. In this example, the capacitors 310, 314, and 318 store charge. Charge is stored by turning the switches 308, 312, and 316 to an off state.

When charging the capacitors 310, 314, and 318, the return switches 332, 334, and 336 are in an on state and the main switches 308, 312, and 316 are off. The path 326 illustrates a path of the current from the power supply 304 that charges the capacitor 318. At the same time, the power supply 304 delivers current through the path 324 to charge the capacitor 314. The path 324, after passing through the capacitor 314, proceeds through the return switch 336 via the connection 330. A similar path through the diode 320 and the return switches 334, and 336 is used to charge the capacitor 310. The current that charges the capacitor 310 proceeds through the connection 328 and then through the return switches 334 and 336. The diodes 320 and 322 isolate the power supply 304 from the pulse and ensure that the current flows to the load 306 during discharge. At the same time, the diodes permit the pulse to pass around any voltage cell that is not functioning.

During discharge of the capacitors, the switches 308, 312, and 316 are turned on using the control signals provided to the switch drives 338, 342, and 346, respectively. At the same time, the control signals are delivered to the switch drives 340, 344, and 348 to turn the return switches 332, 334, and 336 off. When the return switches 332, 334, and 336 are turned off, the discharge current does not flow through the return switches and is delivered to the load 306.

As illustrated in FIG. 3B, the connection 328 is shown as a wire or short while the connection 330 is illustrated as an inductor. Typically, all of the connections in the voltage cells are the same, but two types of connections are illustrated in this example to describe additional embodiments of the invention. When the connection is an inductor like the connection 330, the timing between turning the switch 316 on and the return switches off can be delayed. An inductive connection 330 can increase the rise time of the leading edge of the pulse.

For example, when the switches 308, 312, and 316 are turned on and the return switches 332, 334, and 336 are also on, a current begins to build in the inductive connections like the connection 330. After allowing the inductance to build, the return switches 332, 334, and 336 can be turned off. There is thus a delay in turning the switches 308, 312, and 316 off and turning the return switches 332, 334, and 336 on. The energy stored in the inductive connection 330 is then added to the energy being discharged from the capacitors 210, 314, and 318. Combining the inductive energy of the inductive connection 330 with the capacitive energy stored in the capacitors 310, 314, and 318 results in a faster rise time of the voltage pulse. One of skill in the art, however, can appreciate that an inductive connection does not require a delay to be incorporated between turning the switches 308, 312, and 316 to an on state and turning the return switches 332, 334, and 336 to an off state.

When the pulse generator is ready to terminate the high voltage pulse, the switches 308, 312, and 316 are typically turned off. The fall time of the high voltage pulse can be improved by turning on the return switches 332, 334, and 336. Opening the path through the return switches can help discharge stray capacitance and/or load capacitance, which improves the fall time of the high voltage pulse.

This example illustrates that the timing used to control the main switches 308, 312, and 316 and of the return switches 332, 334, and 336 can be used to control or alter the rise time and/or the fall time of the resulting voltage pulse. The shape of the voltage pulse can also be programmed in some embodiments.

Figure 4:
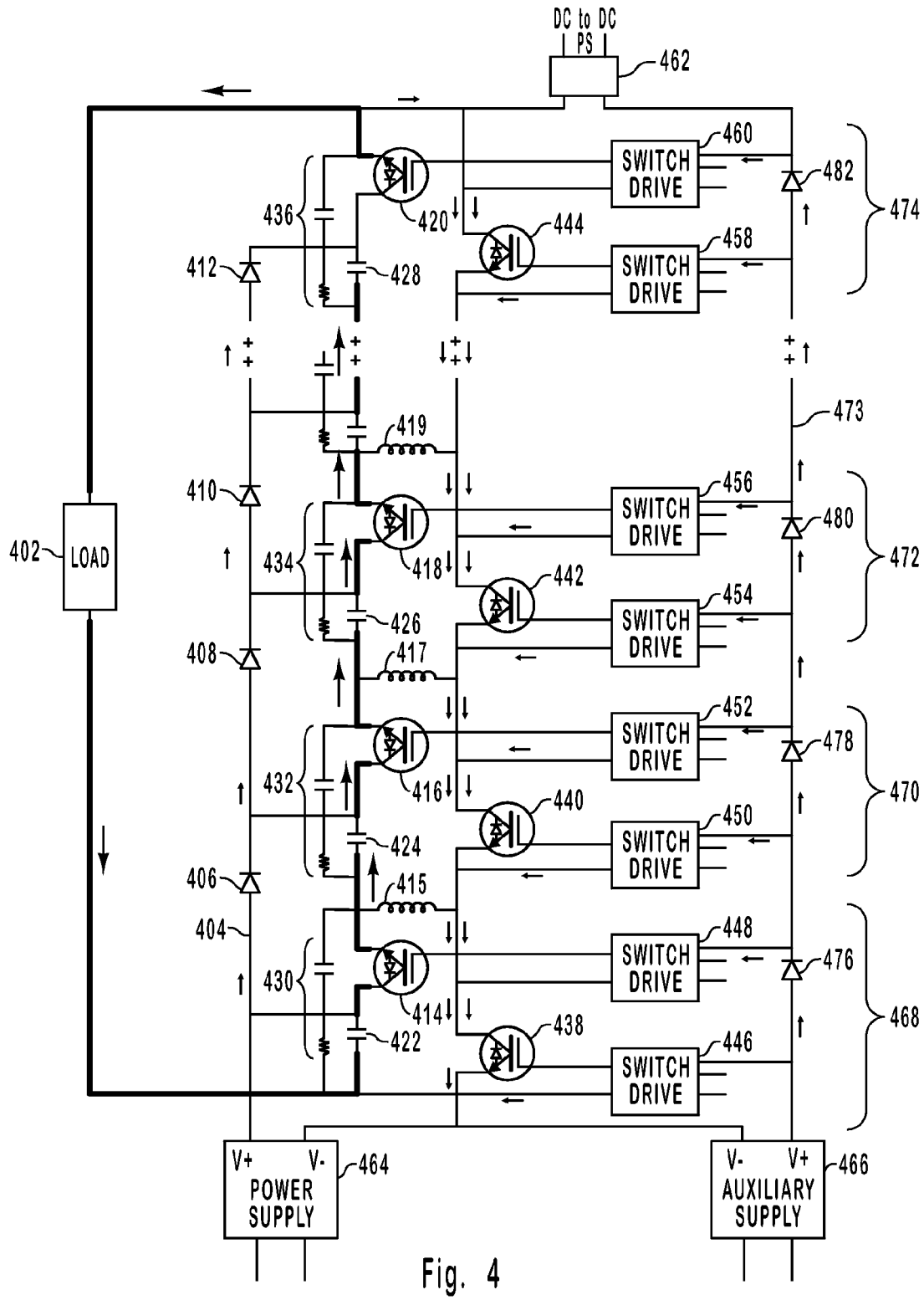
FIG. 4 illustrates one embodiment of a series of voltage cells arranged to generate a positive voltage pulse.

FIG. 4 illustrates a block diagram of a pulse generator that includes multiple voltage cells (also referred to herein as stages or sections). The example of the pulse generator illustrated in FIG. 4 generates a positive voltage pulse. FIG. 4 illustrates the voltage cells 474, 472, 470, and 468 that are connected as previously described using main switches 414, 416, 418, and 420 controlled by switch drives 448, 452, 456, and 460, and return switches 438, 440, 442, and 444 controlled by switch drives 446, 450, 454, and 458. In this example, the return path from the supply line 404 includes inductive connections 415, 417, and 419 from the charging capacitors 422, 424, 426, and 426 through the return switches.

FIG. 4 further illustrates an auxiliary path 473 that is used by the power supply 466 to provide power to the switch drives 446, 448, 450, 452, 454, 456, 458, and 460 (446-460). The auxiliary path 472 includes the auxiliary diodes 476, 478, 480, and 482 (476-482). The auxiliary diodes 476-482 help isolate the power supply 466 and help deliver pulse to the load 402.

The auxiliary diode string that includes the auxiliary diodes 476-482 represent a voltage drop for each diode in the diode string. Thus, the voltage available at a particular stage may be affected by the forward voltage drops of the diodes in the diode string. The voltage provided by the auxiliary power 466 simply provides sufficient voltage to overcome the forward voltage drops of the diodes and/or the charging switch voltage drops. If a large number of voltage cells are included, boosting voltage supplies may be included to provide adequate voltage levels.

The switch drives or switches 446-460, in one embodiment, can be any type of solid state switches known in the art. Bipolar junction transistors, field effect transistors, IGBTs, Darlington Bipolar transistor, solid state switches, and the like are examples of switches that can be used as described herein. Each voltage cell includes a switch drive for a main switch and a switch drive for a return switch. For example, the voltage cell 468 includes a switch drive 448 used to control the main switch 414. In this example, the gate of the main switch 414 is controlled by the switch drive 448. The switch drive 446 controls a state of the return switch 438.

The voltage available to the switch drives 446-460 is often reduced at successive switch drives by the voltage drop across previous diodes in the diode string and switches. Each switch drive can be driven from either ground or from the previous voltage cell. In one embodiment, DC-DC converters may be used to provide adequate voltage. In another embodiment, the switch drives are optically coupled from ground.

The energy storage capacitors 422, 424, 426, and 428 are charged by way of the diodes 406, 408, 410, and 412 and the return switches. Charging the capacitors in this manner eliminates the use of inductors, resistors, or isolated supplies that are common in conventional Marx Generators. In addition, the energy needed to drive the switches can also be provided through the diode string in the auxiliary path 473, eliminating the use of inductors, resistors, or isolated supplies or step down supplies that may otherwise be needed. The switches can be triggered by way of example, fiber optic coupling, transformer coupling, or by the auxiliary power diodes.

The diode string that includes the diodes 406, 408, 410, and 412 provides several advantages. First, the diode string isolates each voltage cell or voltage stage from other voltage cells or stages during the pulse. The diode string also an alternate current path around a particular voltage cell or stage of the switch for that particular voltage cell is not turned on or is delayed. The diode string enables a voltage pulse to be delivered even though a voltage cell is delayed or fails.

FIG. 4 further illustrates balance networks 430, 432, 434, and 436. Each balance network typically includes a capacitor in series with a resistor and each balance network helps balance the stray capacitance to ground. The capacitance in the balance networks helps to equally distribute the voltages from section to section during the rise time and the fall time of the voltage pulse. Because the stray capacitance to ground associated with a particular voltage cell is typically different from the stray capacitance to ground associated with other voltage cells of the pulse transformer, the capacitance and/or resistance of each voltage cell can be adapted to match the stray capacitance "seen" by that voltage cell. Thus the capacitance of the balance network 430 may be different from the capacitance of the balance networks 432, 434, and 436. The capacitance of each balance network is selected to match the stray capacitance. The resistance in each balance network helps reduce ringing of the stray inductance and/or the stray capacitance. In an alternative embodiment as shown in FIG. 8, a ringing circuit may be included in one or more of the voltage cells of a pulse generator to provide at least a smooth droop compensation to the voltage pulse.

The power supply 462 can provide a source of power at the high voltage end of the load 402. For example, if the load 402 is a pulsed tube, then the power supply 462 can provide power for the filament or heater of the pulsed tube. Thus power supply 462 provides a power source at the high voltage end without additional equipment.

Figure 5:
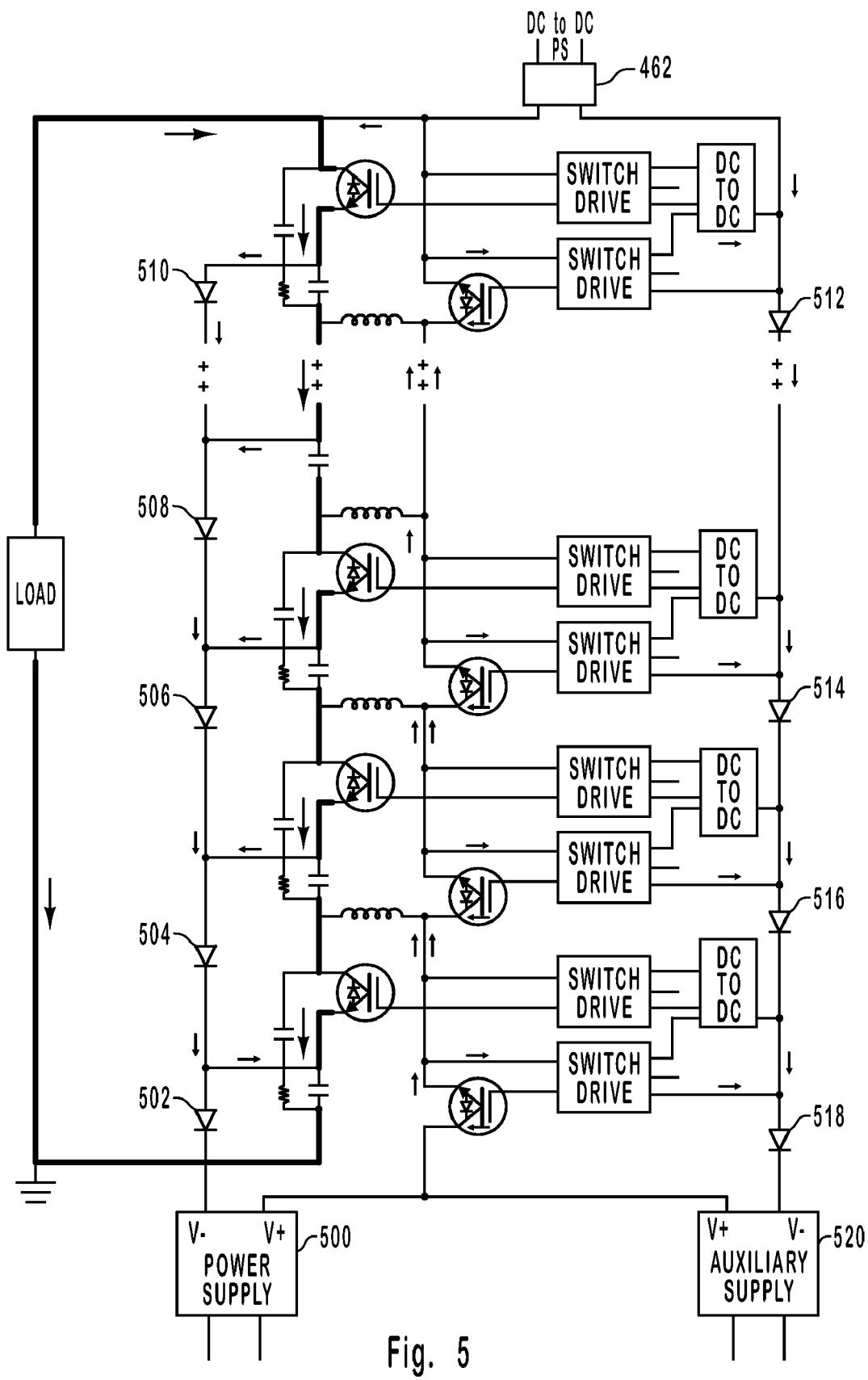
FIG. 5 illustrates one embodiment of a series of voltage cells arranged to generate a negative voltage pulse.

FIG. 5 illustrates another embodiment of a pulse generator. FIG. 5 is similar to the pulse generator illustrated in FIG. 4, with the difference that the pulse generator in FIG. 5 generates a negative voltage pulse whereas the pulse generator of FIG. 4 generates a positive pulse. The charging diodes 502, 504, 506, 508, and 510 and the auxiliary diodes 512, 514, 516, and 518 are configured to accommodate a negative power supply 500, 520. The switches and the return switches are also adapted to a negative supply.

Figure 6:
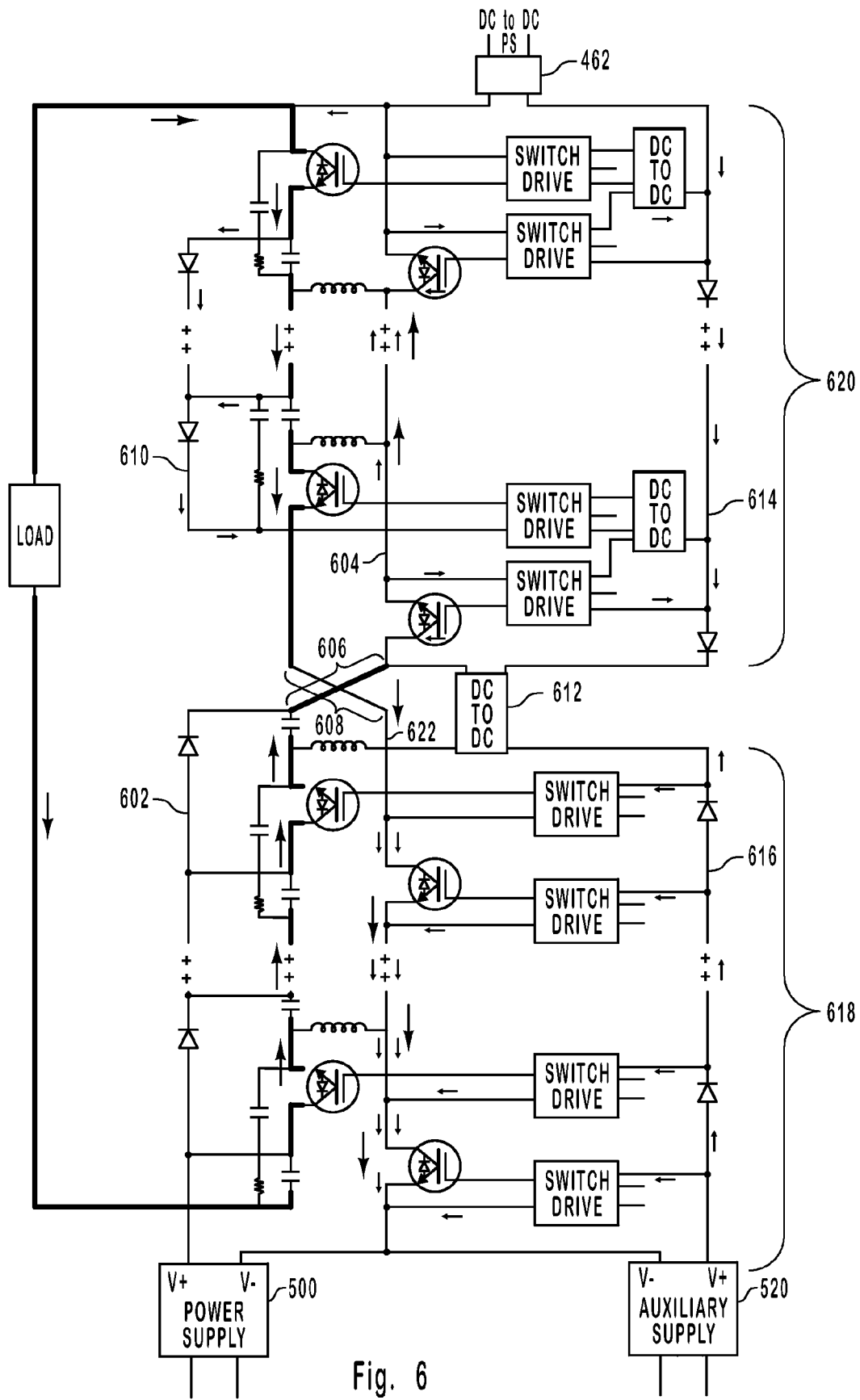
FIG. 6 illustrates an embodiment of a pulse generator that can generate both positive and negative pulses.

FIG. 6 illustrates an embodiment of a pulse generator that has a bipolar output. In other words, the pulse generator 600 illustrated in FIG. 6 can generate both positive and negative type voltage pulses. The bipolar pulses can be generated by stacking voltage cells configured to generate a positive voltage pulse in series with voltage cells configured to generate a negative voltage pulse.

In FIG. 6 the positive voltage cells 618 generate a positive type voltage pulse and the negative voltage cells 620 generate a negative type voltage pulse. The voltage cells 618 are in series with the voltage cells 620. In this example, the diode string 602, which is used to charge the capacitors in the voltage cells 618, is connected with the return line switch string 604 of the voltage cells 620 via the connection 606. Similarly, the diode string 610, which is used to charge the capacitors in the voltage cells 620, is connected in series with the return line switch string 622 of the voltage cells 618 via the connection 608. The negative supply auxiliary diode string 614 is connected with the positive supply auxiliary diode string 616 using an inverting DC-DC supply 612. All of the capacitors in the positive voltage cells 618 and the negative voltage cells 620 can be charged at the same time.

Figure 7:
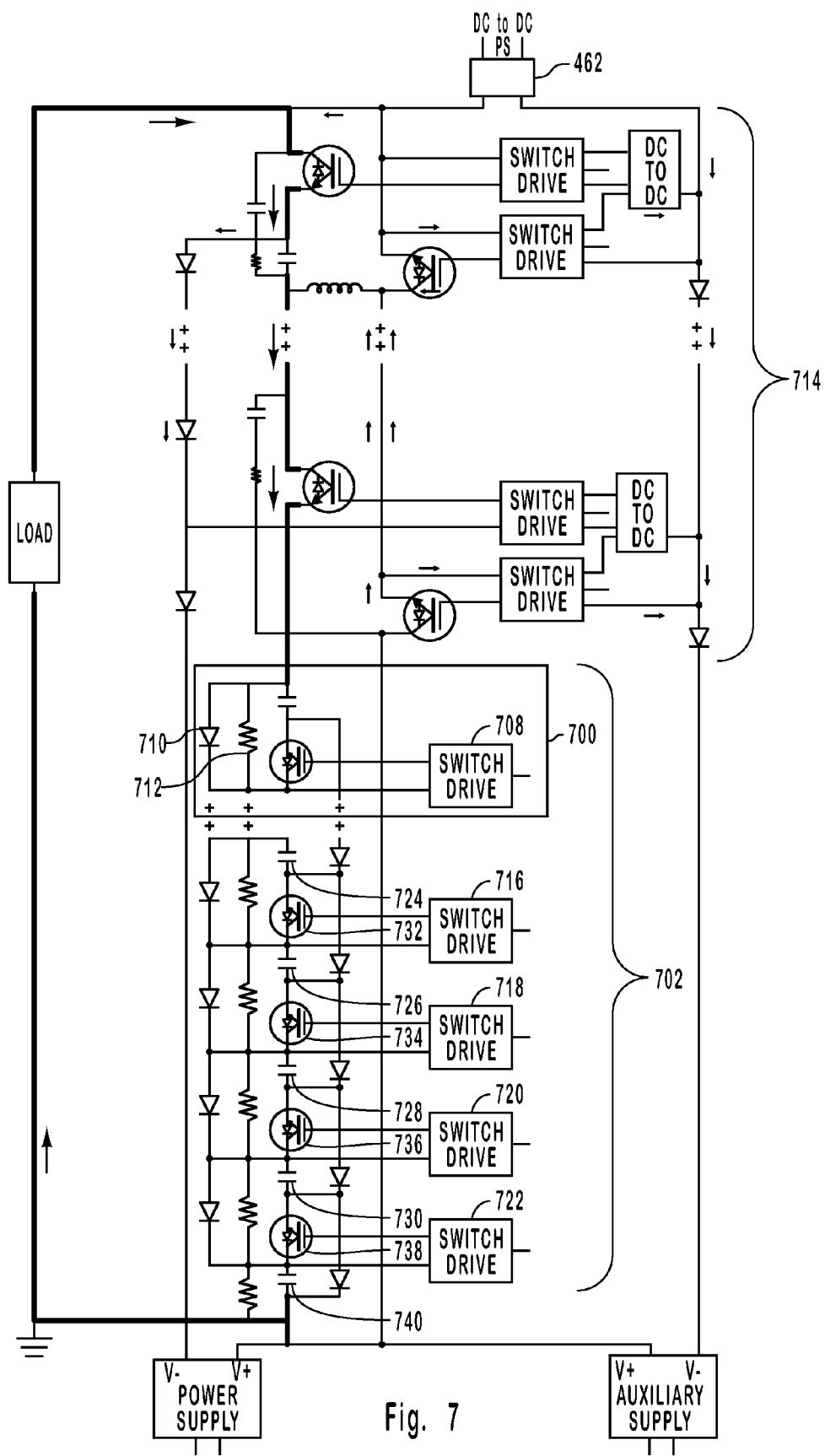
FIG. 7 illustrates another embodiment of a pulse generator that includes voltage cells arranged to provide droop control for the voltage pulse.

FIG. 7 illustrates an embodiment of a pulse generator that includes droop correction. More particularly, FIG. 7 illustrates droop correction for a negative type pulse generator. The embodiment of the pulse generator illustrated in FIG. 7 includes a plurality of voltage cells 714 as previously described. In this example, the voltage cells 714 are connected with a series of cells 702 that are different from the voltage cells 714.

In this example, the voltage cells 702 are configured such that they charge in series and discharge in parallel. The switch drives 708, 716, 718, 720, and 722, control the switches 706, 732, 734, 736, and 738 such that the capacitors 704, 724, 726, 728, 730, and 740 charge in series. At the same time, the storage capacitors of the voltage cells 714 are charging in parallel. However, the voltage cells 702 are configured to provide droop correction.

When the switches in the voltage cells 702 are on, the capacitors charge in series. During the voltage pulse, the voltage cells 702 can be discharged such that the shape of the voltage pulse can be adjusted. In one embodiment, the droop can be corrected across the entire pulse by controlling or delaying the discharge of the capacitors in the voltage cells 702.

In another embodiment of the invention, the pulse may drive a pulse transformer with a core that needs to be reset. A reset supply could be included in series with the ground end of the charging switch to provide the core reset current. This eliminates the need to have a core reset inductor.

FIGS. 8A through 8D illustrate additional embodiments of a voltage cell including circuit that provides droop compensation. FIGS. 8A through 8D also illustrate the ability to isolate a defective or non-functioning voltage cell. When a pulse generator is constructed, it may include a plurality of voltage cells. Embodiments of the invention provide droop compensation by including a ringing circuit. However, only one or a few of these voltage cells need to have a ringing circuit in order to provide droop correction or droop compensation. The majority of the voltage cells can be as described herein and do not necessarily need to include the ringing circuit.

In this example, the capacitors 802 are used to store the charge that is delivered to a load. Other capacitors in the serially connected voltage cells also store charge that will be delivered to the load as a voltage pulse. As previously described, the capacitors 802 can be charged in series as the current flows from the charging source 824 through the diode 836. The current used to charge the capacitor(s) in the voltage cell 820 flows from the charging power 824 through the return switch 814, which is on, and up to the voltage cell 820 and then back through the diode string 822 to the charging power 824.

Figure 8A:
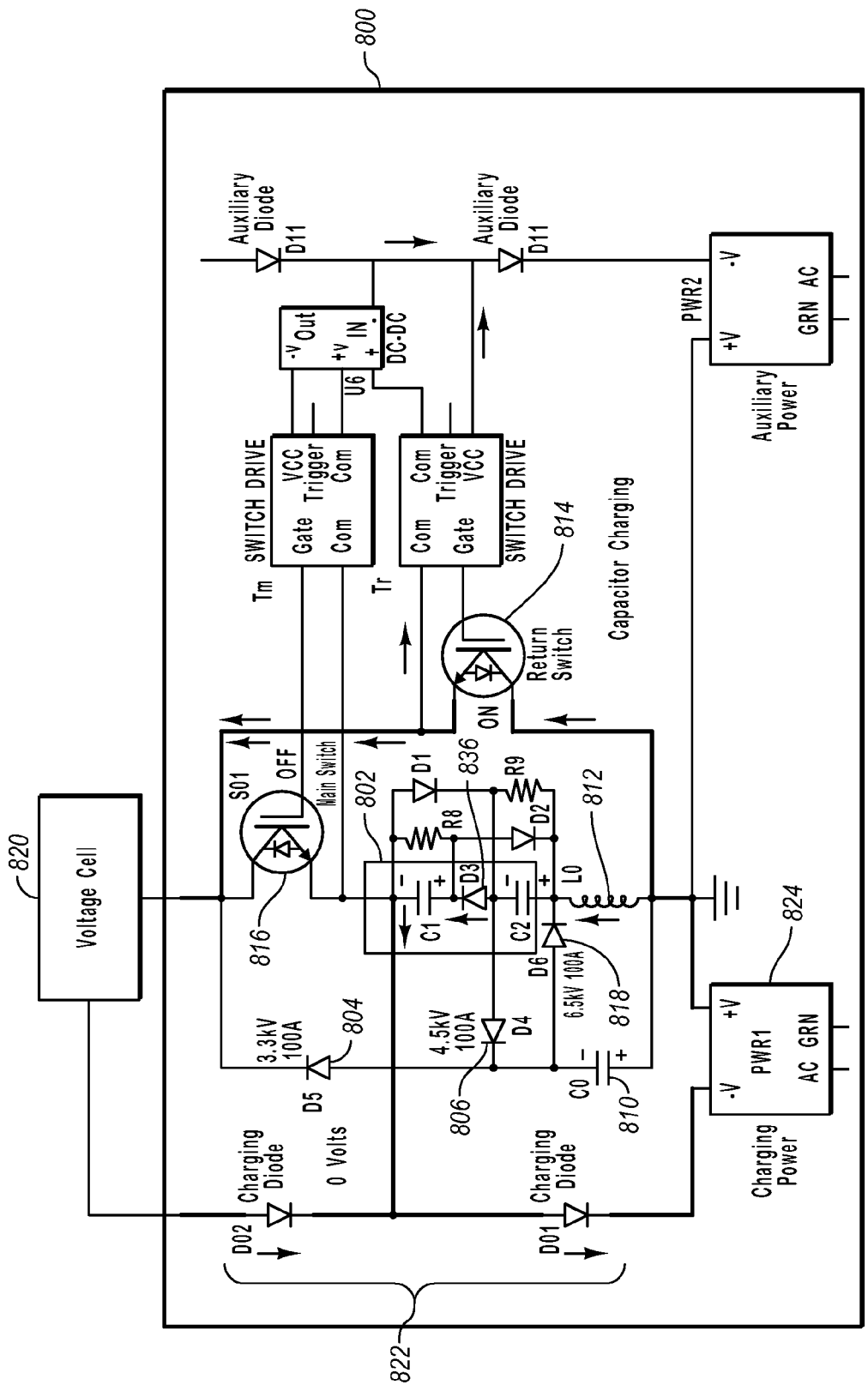
FIGS. 8A through 8D illustrate an embodiment of a portion of a pulse generator that provides droop control in a pulse generator.

In this manner, the capacitors 802 are charged, as illustrated in FIG. 8A, when the main switch 816 is off and the return switch 814 is turned on. When the return switch is turned on in this manner, current can flow to the capacitors in the next voltage cell 820. Because the main switches in the series connected voltage cells are turned off, the capacitors 802 do not discharge. The current through the return switch 814 can return through the diode string 822. In this manner, the capacitors in the voltage cells are charged effectively in parallel by the charging power supply 824.

The voltage cell 800 in FIG. 8A also illustrate an inductor 812, a capacitor 810, and diodes 804, 806, and 818. The diodes 818 and 806 prevent the capacitors 802 from discharging. When the main switch 816 is turned on, the diode 804 prevents the current stored in the capacitors from discharging through the capacitor 810 and insures that the voltage pulse is delivered to the load.

As previously indicated, a voltage pulse may begin to droop over time. The ringing circuit that includes the capacitor 810 and the inductor 812 can provide droop compensation that is smoother than the droop compensation illustrated in FIG. 7. In this case, as the capacitors 802 begin to discharge, the ringing circuit begins to ring, creating a half sine wave in one embodiment that provides droop compensation to the voltage pulse. Advantageously, this provides smooth droop compensation in one embodiment rather than jagged or saw tooth compensation to the voltage pulse.

Figure 8B:
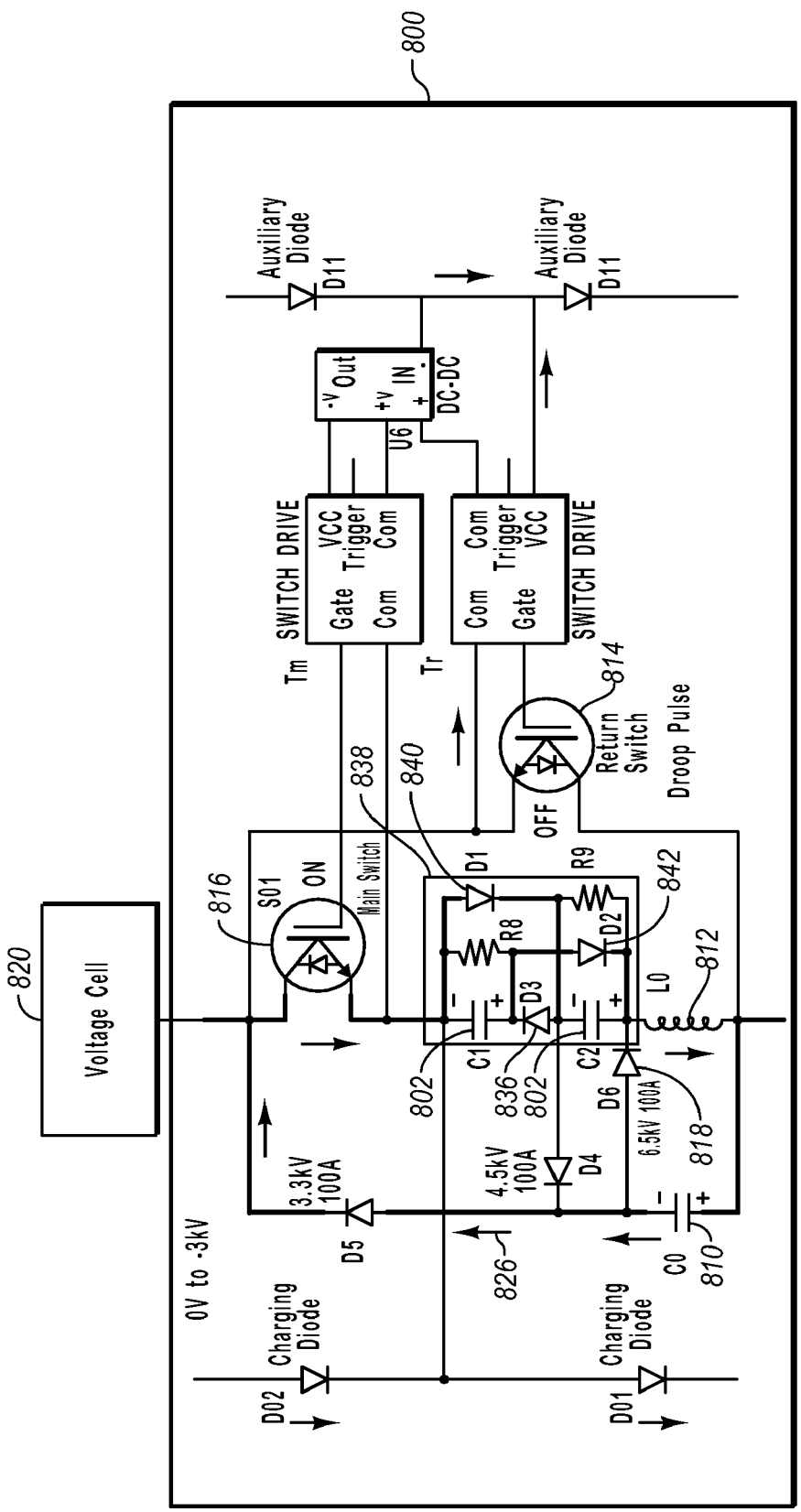

More specifically, FIG. 8B illustrates a voltage cell that is discharging and providing droop compensation. In this example, the main switch 816 is turned on and the return switch 814 is turned off. Thus, the capacitors 802 of the serially connected voltage cells 800, 820 (additional voltage cells may be similarly connected as previously described) are connected and are discharging through the open switches to the connected load, which may be in parallel to the serially connected voltage cells.

In a voltage cell that includes a ringing circuit, the diodes 842, 836, and 840 enable the capacitors 802 to charge in series and also cause the capacitors to discharge in parallel. Although the capacitors 802 in the cell 800 charge in series, the capacitors 802 are charging in parallel with other capacitors in other voltage cells as previously described.

As a result, the voltage cell 800 is connected with the ringing circuit such that when the switch 816 is turned on, the capacitors have half of the voltage. The ringing circuit begins to ring and the capacitor 810 is charged to twice the voltage. The capacitor 810 thus charges in a sine wave and provides smooth boost compensation to the voltage pulse. In this example, the circuit 838 includes diodes and resistors that provide a path for the charge to discharge in parallel.

The droop compensation or droop correction is provided by the ringing circuit. In this example, the inductor 812 and the capacitor 801 begin to ring and as the capacitor 810 begins to charge, it can discharge through the switch 816, which is on, and to the load. The ringing has the effect of providing droop compensation to the voltage pulse. By varying the values of the capacitor 810 and of the inductor 812, the droop compensation can be selectively provided and controlled. In other words, the capacitor 810 begins discharging after the capacitors in other voltage cells are discharging, thereby compensating for voltage droop in the voltage pulse.

Figure 8C:
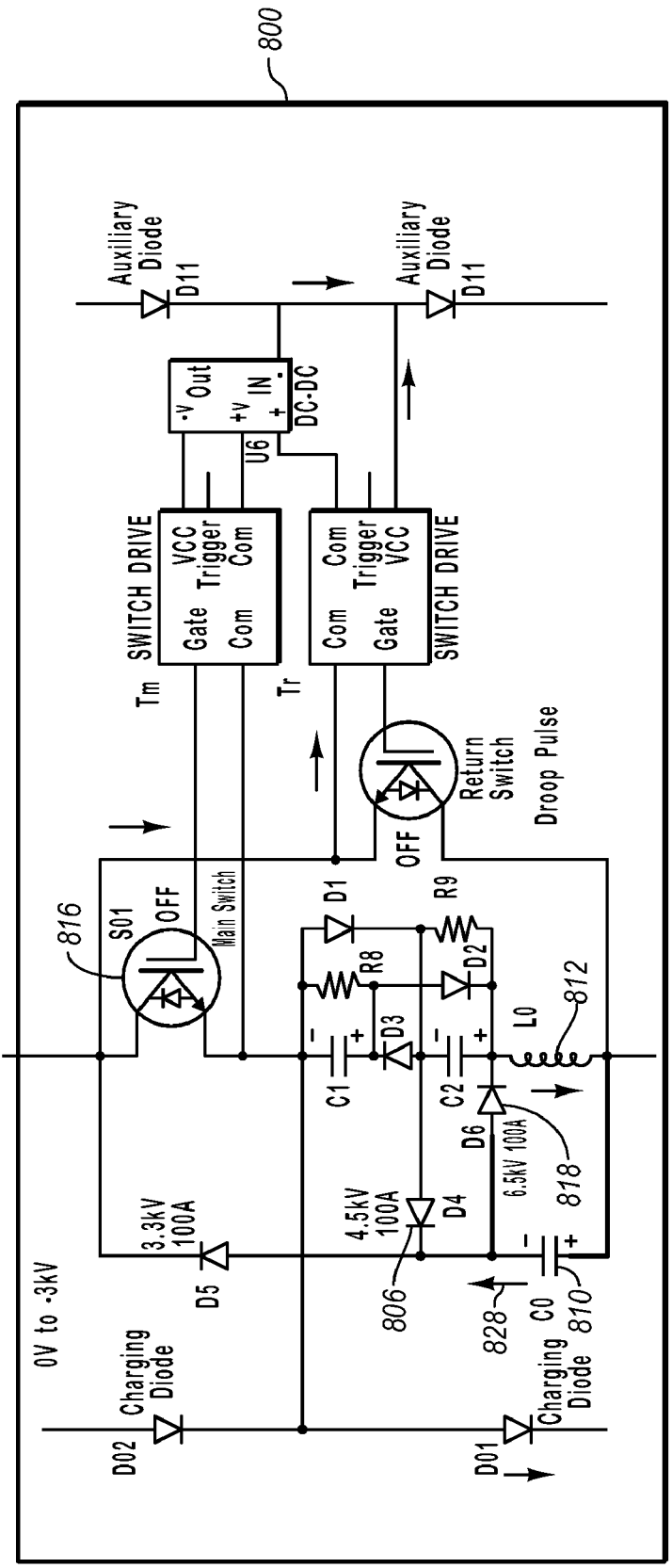
Figure 8D:
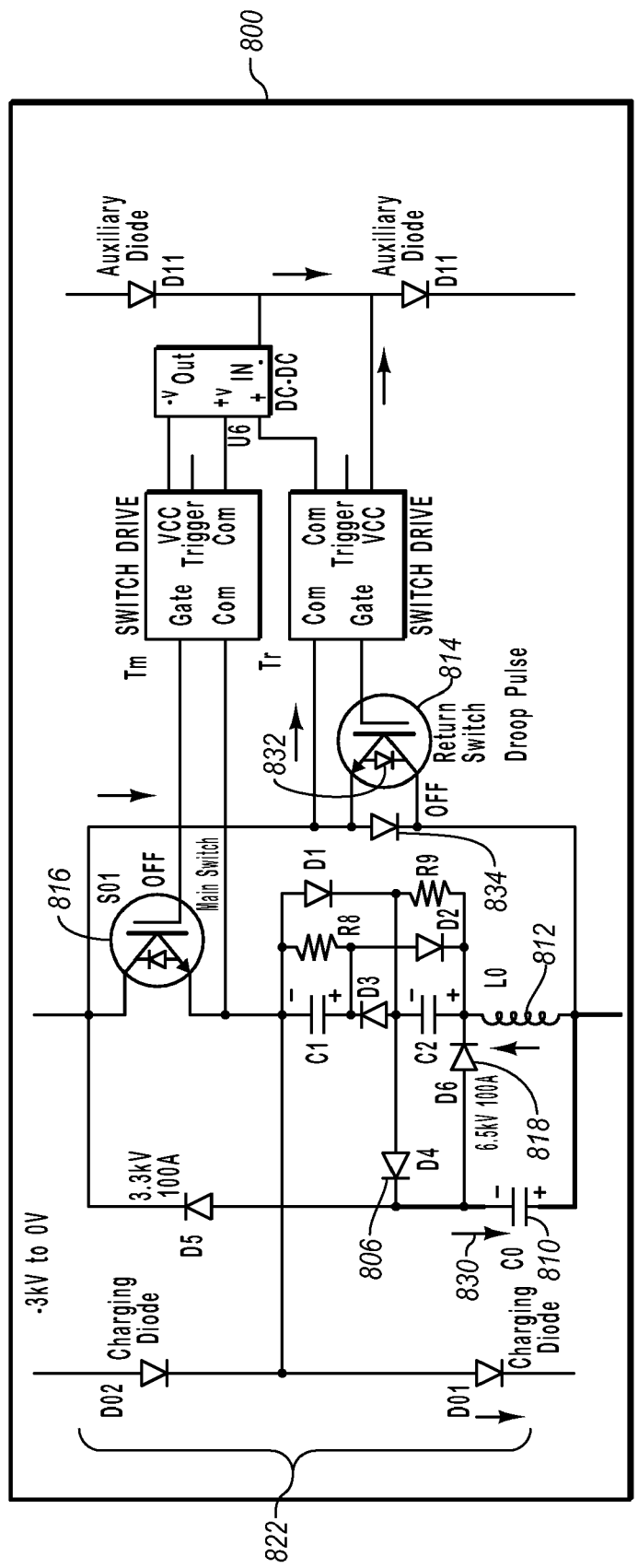

FIGS. 8C and 8D illustrate the ringing circuit after the main switch 816 is turned off after the pulse is provided. When the main switch 816 is turned off (along with the main switches in other voltage cells), the ringing circuits of the voltage cells become isolated. The residual current in the inductor 812 or charge in the capacitor 810 discharges in the ringing circuit in an isolated manner. FIG. 8C, for example, illustrates that the current 828 discharges from the capacitor 810 through the diode 818. FIG. 8D, on the other hand, illustrates that the current in the inductor 812 discharges to the capacitor 810 through the diode 806. In this manner, the ringing circuit illustrated in FIGS. 8A through 8D is an example of providing smooth droop compensation to a voltage pulse.

FIG. 8D also illustrates an embodiment of the invention that can isolate a defective cell or isolate a cell that may not be functioning correctly without having an adverse impact on the generation of a voltage pulse. In this case, the return switch illustrated in FIG. 8D (and in other Figures) includes a diode 832. If the return switch does not include such a diode, the diode 834 can be included in the voltage cell across the return switch in this example. The diode 832 provides a path for the discharge current when the return switch 814 is off and the cell is defective. Thus, the diode 832 or 834 becomes an isolation diode that enables the pulse to be delivered when a particular voltage cell is inoperative for various reasons.

Usually, when the voltage cell 800 is operating normally, the diode 832 or 834 is reverse biased during discharge such that current discharges through the capacitors. When the cell is defective, the switch 816 can be turned off and this enables the discharge current to pass around the defective voltage cell through the diode 832 or 834.

When the return switch is on to permit charging of the capacitors 802, the main switches are off and the current is prevented from discharging through the diode 832 because the voltage cells are effectively isolated when the main switches are off and the diode 832 is reversed biased. Alternatively, the discharge current can be delivered through the diode string 822.

In one embodiment, a pulse generator that includes multiple voltage cells can be constructed. Such a pulse generator has multiple redundancy that provides protection for several events. If a voltage cell is defective, the amount of charge initially stored in the capacitors of the remaining voltage cells can be altered such that the voltage pulse is not affected. In this case, the pulse generator may include more voltage cells than are required for a particular duty. Also, the voltage cells are constructed in a manner that permits the voltage pulse to be delivered even when a cell is defective. In other words, embodiments of the invention provide cell isolation and redundancy.

Embodiments of the invention provide several advantages and benefits. The shape of the pulse as well as the rise time and the fall time can be programmed or controlled. For example, the rise time and fall time can be controlled by selection of the components in the ringing circuit. The rise time and/or the fall time can also be controlled by timing when the main switches and/or the return switches are turned on/off. In addition the length of the pulse can also be programmed.

For example, a pulse generator typically includes enough voltage cells to generate a wide range of voltage pulses. In some instances, not all of the voltage cells may be needed to generate a particular pulse. By controlling the timing of the main switches and the return switches can control the length of the voltage pulse. In another example, by turning the return switches on at the end of the pulse, the fall time of the voltage pulse can increase because any residual voltage has another path in which discharge can occur.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A pulse generator that generates a voltage pulse that is applied to a load, the pulse generator comprising:
    a plurality of first voltage cells, each voltage cell having a capacitor in series with a main switch such that all capacitors are connected in series when all main switches are on to generate a voltage pulse that is delivered to a load; and
    a second voltage cell connected in series with the plurality of first voltage cells, the second voltage cell including:
        a pair of capacitors in series with a second main switch;
        at least a first diode arranged with the pair of capacitors such that the pair of capacitors charge in series when the main switch is off and discharge in parallel when the main switch is on; and
        a ringing circuit that includes:
            an inductor in series with the pair of capacitors; and
            a ringing capacitor in parallel with the inductor, wherein the ringing capacitor charges to twice a value of the pair of capacitors and provides droop compensation to the voltage pulse.

2. A pulse generator as defined in claim 1, wherein the pair of capacitors are connected such that the pair of capacitors charge in series with the capacitors in the plurality of first voltage cells and discharge in parallel to the ringing circuit.

3. A pulse generator as defined in claim 1, wherein the plurality of first voltage cells each comprise a return switch.

4. A pulse generator as defined in claim 3, wherein a charging source provides a charging current that passes through each of the return switches to charge the capacitors in the plurality of first voltage cells.

5. A pulse generator as defined in claim 4, further comprising a diode string that provides a return path to the charging source for the charging current.

6. A pulse generator as defined in claim 1, wherein the second voltage cell further comprises a second diode between the pair of capacitors.

7. A pulse generator as defined in claim 1, the second voltage cell further comprising a second return switch.

8. A pulse generator as defined in claim 7, wherein control signals are used to turn the main switches and the return switches on or off in order to control a rise time or a fall time of the voltage pulse.

9. A pulse generator as defined in claim 1, wherein the ringing circuit provides smooth compensation by generating a half sine wave voltage output.

10. A pulse generator that generates a voltage pulse that is applied to a load, the pulse generator comprising:
    a main switch;
    a first capacitor in series with the main switch;
    a second capacitor in series with the first capacitor;
    a first diode connected between the first and second capacitor, wherein a charging current charges the first and second capacitor in series;
    a ringing circuit connected to the first and second capacitor, the ringing circuit including:
        a first inductor in series with the first and second capacitor; and
        a third capacitor across the first and second capacitor; and
    a plurality of diodes arranged with the first and second capacitor such that the first and second capacitor charge in series when the main switch is off and discharge in parallel when the main switch is on, wherein the ringing circuit generates a voltage that is twice the voltage of the discharging first and second capacitor and that provides smooth droop compensation to a voltage pulse.

11. A pulse generator as defined in claim 10, further comprising a return switch, wherein the charging current passes from a charging source through the return switch and charges a capacitor of another voltage cell.

12. A pulse generator as defined in claim 11, further comprising a first switch drive that controls the main switch and a second switch drive that controls the return switch.

13. A pulse generator as defined in claim 10, further comprising a plurality of voltage cells connected in series with the first and second capacitor, wherein the plurality of voltage cells each have a capacitor that receives a charging current through a return switch of another voltage cell.

14. A pulse generator as defined in claim 10, wherein the main switch and the return switch are controlled with control signals in a manner that permits a rise time of the voltage and a fall time of the voltage pulse to be controlled.

15. A pulse generator as defined in claim 14, wherein the return switch is turned on to increase a fall time of the voltage pulse by allowing charge to dissipate through the return switch.

16. A pulse generator as defined in claim 14, wherein the main switch is powered thorough an auxiliary diode string and wherein the control signals are optically coupled to the main switch and to the return switch.

17. A voltage pulse generator for generating a voltage pulse, the voltage pulse generator comprising:
   a plurality of first voltage cells each having a main switch and a capacitor in series such that each main switch and each capacitor is in series with other main switches and other capacitors in other first voltage cells when the main switches are on, wherein the capacitors are isolated from each other until the main switches are turned on such that the serially connected capacitors deliver a voltage pulse without using transformers;
   a diode string connected with the plurality of first voltage cells;
   a plurality of first return switches included in the plurality of first voltage cells, wherein a charging current passes through the first return switches and the diode string such that the capacitors in the plurality of first voltage cells are charged in parallel; and
   a second voltage cell comprising:
      a second main switch;
      at least a pair of capacitors in series with the main switch and connected using a plurality of diodes such that the pair of capacitors charge in series and such that the pair of capacitors charge in parallel with respect to the capacitors in the plurality of first voltage cells, wherein the plurality of diodes are arranged such that the pair of capacitors discharge in parallel when the second main switch is on; and
      a ringing circuit connected to the pair of capacitors, wherein the ringing circuit rings when the pair of capacitors discharge to generate a half sine wave voltage that provides droop compensation to the voltage pulse, the ringing circuit including an inductor in series with the pair of capacitors and a third capacitor across the pair of capacitors.

18. A voltage pulse generator as defined in claim 17, further comprising ringing diodes that are connected between the ringing circuit and the pair of capacitors such that energy in the inductor or in the third capacitor can discharge into the pair of capacitors when the main switch is turned off.

* * * * *